(12) United States Patent
Yang et al.

(10) Patent No.: US 8,440,482 B2
(45) Date of Patent: May 14, 2013

(54) TRANSFLECTIVE LIQUID CRYSTAL DISPLAY PANEL AND MANUFACTURING METHOD THEREOF

(75) Inventors: Sweehan J. H. Yang, Tainan (TW);
Po-Sheng Shih, Hsinchu (TW);
Chian-Chih Hsiao, Taipei County (TW);
Hsien-Tang Hu, Taichung County (TW);
Ting-Chung Liu, Taipei (TW)

(73) Assignee: HannStar Display Corp., Wugu Industrial Zone, Taipei County (TW)

(*) Notice: Subject to any disclaimer, the term of this patent is extended or adjusted under 35 U.S.C. 154(b) by 194 days.

(21) Appl. No.: 12/969,543

(22) Filed: Dec. 15, 2010

(65) Prior Publication Data

US 2011/0147749 A1    Jun. 23, 2011

(30) Foreign Application Priority Data

Dec. 17, 2009  (TW) ............................... 98143347 A

(51) Int. Cl.
*H01L 33/16* (2010.01)
*H01L 33/46* (2010.01)

(52) U.S. Cl.
USPC 438/30; 257/59; 257/E33.004; 257/E33.072; 349/114

(58) Field of Classification Search ............. 438/30; 257/59, E33.004, E33.072
See application file for complete search history.

(56) References Cited

U.S. PATENT DOCUMENTS

| 7,397,528 | B2 | 7/2008 | Okumura | |
| 7,405,428 | B2 | 7/2008 | Yun | |
| 7,426,004 | B2 | 9/2008 | Hu | |
| 7,439,541 | B2* | 10/2008 | Lee et al. | 257/59 |
| 7,521,298 | B2 | 4/2009 | Kuo | |
| 7,929,070 | B2* | 4/2011 | Chiang et al. | 349/46 |
| 2007/0264597 | A1* | 11/2007 | Fu | 430/318 |
| 2009/0302318 | A1* | 12/2009 | Chang | 257/59 |

FOREIGN PATENT DOCUMENTS

| CN | 101082721 A | 12/2007 |
| JP | 2003-202590 | * 7/2003 |
| JP | 2009139853 A | 6/2009 |

OTHER PUBLICATIONS

Syuan Ling Yang et al., Advanced Transflective Multi-Domain Vertical Aligned Liquid Crystal Display (ATR-MVA LCD) with Micro Bump Technology, 2008, pp. 1928-1930, SID 08 Digest.

* cited by examiner

*Primary Examiner* — Walter H Swanson
(74) *Attorney, Agent, or Firm* — Winston Hsu; Scott Margo

(57) ABSTRACT

A method for manufacturing a transflective liquid crystal display panel includes providing an array substrate having a plurality of pixel regions, each of the pixel regions includes a device region, a transmission region and a reflection region defined therein; forming a first metal layer on the array substrate; patterning the first metal layer to simultaneously form a gate electrode in the device region and a plurality of metal bumps in the reflection region; forming a first insulating layer having a rough surface and covering the gate electrode and the metal bumps on the array substrate; forming a patterned semiconductor layer on the gate electrode; forming a reflective layer covering the first insulating layer and having a rough surface in the reflection region; and sequentially forming a patterned second insulating layer and a transparent pixel electrode on the array substrate.

3 Claims, 14 Drawing Sheets

TRANSFLECTIVE LIQUID CRYSTAL DISPLAY PANEL AND MANUFACTURING METHOD THEREOF

BACKGROUND OF THE INVENTION

1. Field of the Invention

The present invention relates to a liquid crystal display (LCD) panel and manufacturing method thereof, and more particularly, to a transflective LCD panel and manufacturing method thereof.

2. Description of the Prior Art

LCD panels can be classified into transmissive, reflective, and transflective types based upon the source of illumination. Along with the popularization of portable electronic products, the LCDs have to give consideration to the brightness of indoor ambient light and that of outdoor ambient light, which are different greatly from each other. Therefore the transflective LCD panel is developed to provide superior performance in abovementioned different environments.

Please refer to FIG. 1, which is a schematic drawing of a conventional transflective LCD panel. As shown in FIG. 1, a transflective LCD panel 100 includes an array substrate 102, a color filter substrate 104 opposite to the array substrate 102, and a liquid crystal layer 106 sandwiched in between the array substrate 102 and the color filter substrate 104. The transflective LCD panel 100 also includes a plurality of pixel regions 110, and each pixel region 110 includes a reflection region 112 and a transmission region 114. The pixel regions 110 defined on the array substrate 102 respectively includes a thin film transistor (TFT) 120 and the TFT 120 is positioned in the reflection region 112 as shown in FIG. 1. In order to make optical path lengths of the transmitting light and the reflected light the same, the prior art further forms an organic insulating layer 130 covering the TFT 120 on the array substrate 102 in the reflection region 112 after forming the TFT 120. The organic insulating layer 130 is patterned to form a predetermined pattern by a photomask, then a reflective layer 132 is formed on the organic insulating layer 130. Because the predetermined pattern formed on the surface of the organic insulating layer 130, the reflective layer 132 formed along with the profile of the predetermined pattern obtains a rough surface. Consequently, reflectivity is improved. In the transmission region 114, a transparent pixel electrode 140 is formed and electrically connected to the TFT 120 through a contact hole 134 in the organic insulating layer 130.

As mentioned above, in order to make the optical path lengths of the transmitting light and the reflected light the same, the organic insulating layer 130 is provided in the transflective LCD panel 100 to raise the reflection region 112. Furthermore, a photomask is needed to define the position and the profile of the organic insulating layer 130. Accordingly, the organic insulating layer 130 is thickened to even a half of the cell gap. In other words, the formation of the organic insulating layer 130 unavoidably increases the process time and the process cost. It is noteworthy that as illustration denoted in circle 150, the height difference, which is caused by the organic insulating layer 130, in the border between the reflection region 112 and the transmission region 114 complicates the process control when forming the pixel electrode 140, even makes open line fault of the pixel electrode 140. In addition, to improve the reflectivity, the photomask is employed to form the predetermined pattern in the organic insulating layer 130 of the conventional transflective LCD panel 100, thus a rough surface is obtained after forming the reflective layer 132. Accordingly, it is conceivable that fabrication of a transflective LCD panel 100 is more complicated and more difficult in process control.

SUMMARY OF THE INVENTION

According to an aspect of the present invention, there is provided a method for manufacturing a transflective LCD panel. The method includes providing an array substrate having a plurality of pixel regions, each of the pixel regions comprising a device region, a transmission region and a reflection region; forming a first metal layer on the array substrate; patterning the first metal layer to form a gate electrode in the device region and a plurality of metal bumps in the reflection region simultaneously; forming a first insulating layer on the array substrate, the first insulating layer covering the gate electrode and the metal bumps, and the first insulating layer having a rough surface thereby; forming a patterned semiconductor layer on the gate electrode in the device region; forming a reflective layer in the reflection region, the reflective layer covering the first insulating layer and having a rough surface thereby; and sequentially forming a patterned second insulating layer and a pixel electrode on the array substrate.

According to another aspect of the present invention, there is provided another method for manufacturing a transflective LCD panel. The method includes providing an array substrate having a plurality of pixel region, each of the pixel regions comprising a device region, a transmission region and a reflection region; forming a gate electrode on the array substrate in the device region; sequentially forming a first insulating layer and a patterned semiconductor layer on the array substrate; patterning the first insulating layer to form a plurality of bumps in the reflection region; forming a reflective layer in the reflection region, the reflective layer covering the bumps and having a rough surface thereby; and sequentially forming a patterned second insulating layer and a pixel electrode on the array substrate.

According to another aspect of the present invention, there is provided a transflective LCD panel. The transflective LCD panel includes an array substrate having a plurality of pixel regions, and each of the pixel regions comprises a device region, a transmission region and a reflection region; a TFT formed on the array substrate in the device region; a plurality of bumps formed on the array substrate in the reflection region; a reflective layer formed on the array substrate in the reflection region and having a rough surface by covering the bumps; and a pixel electrode formed on the array substrate in the transmission region and the reflection region, and the pixel electrode is electrically connected to the TFT.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
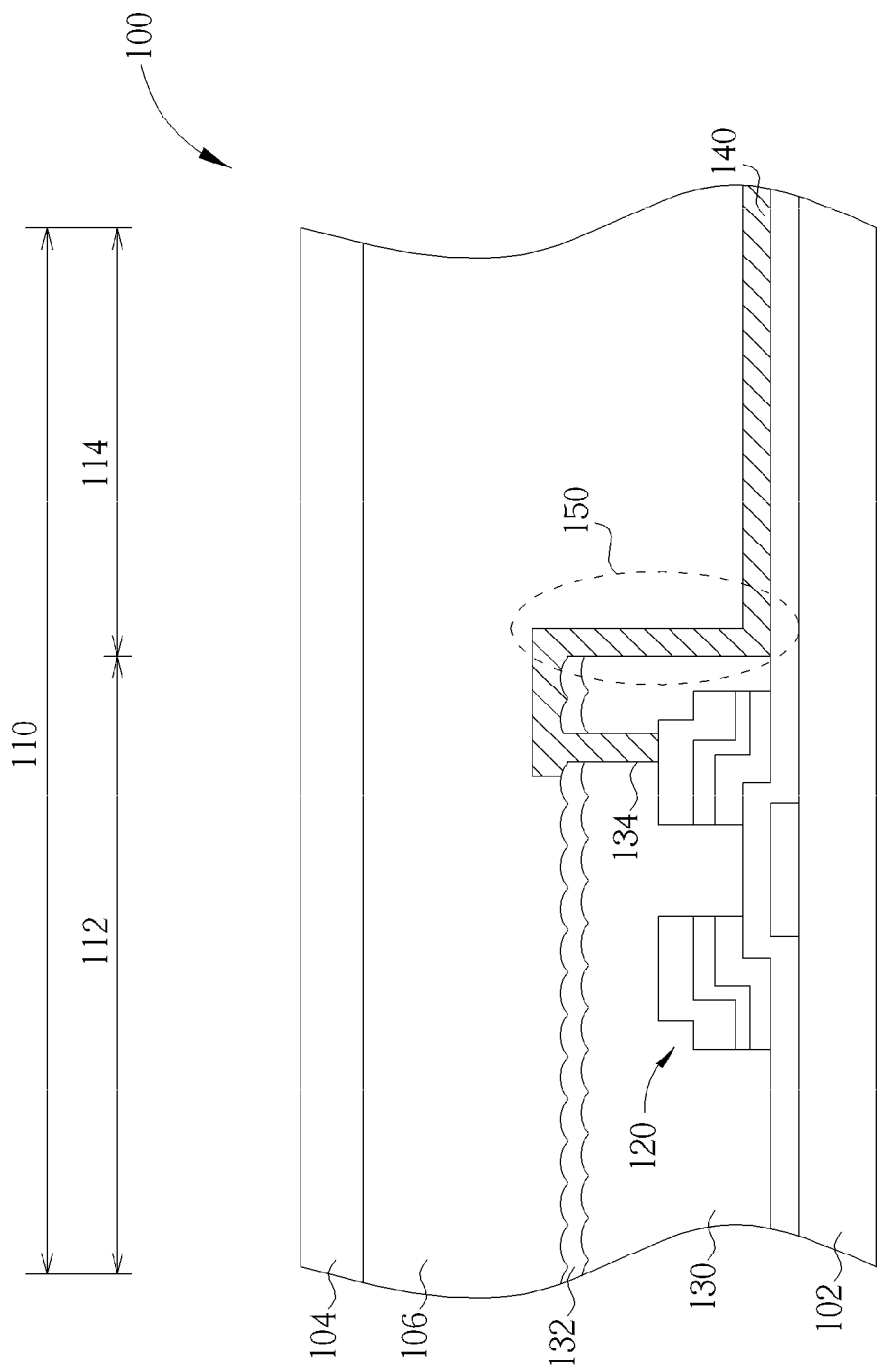
FIG. 1 is a schematic drawing of a conventional transflective LCD panel.
Figure 2:
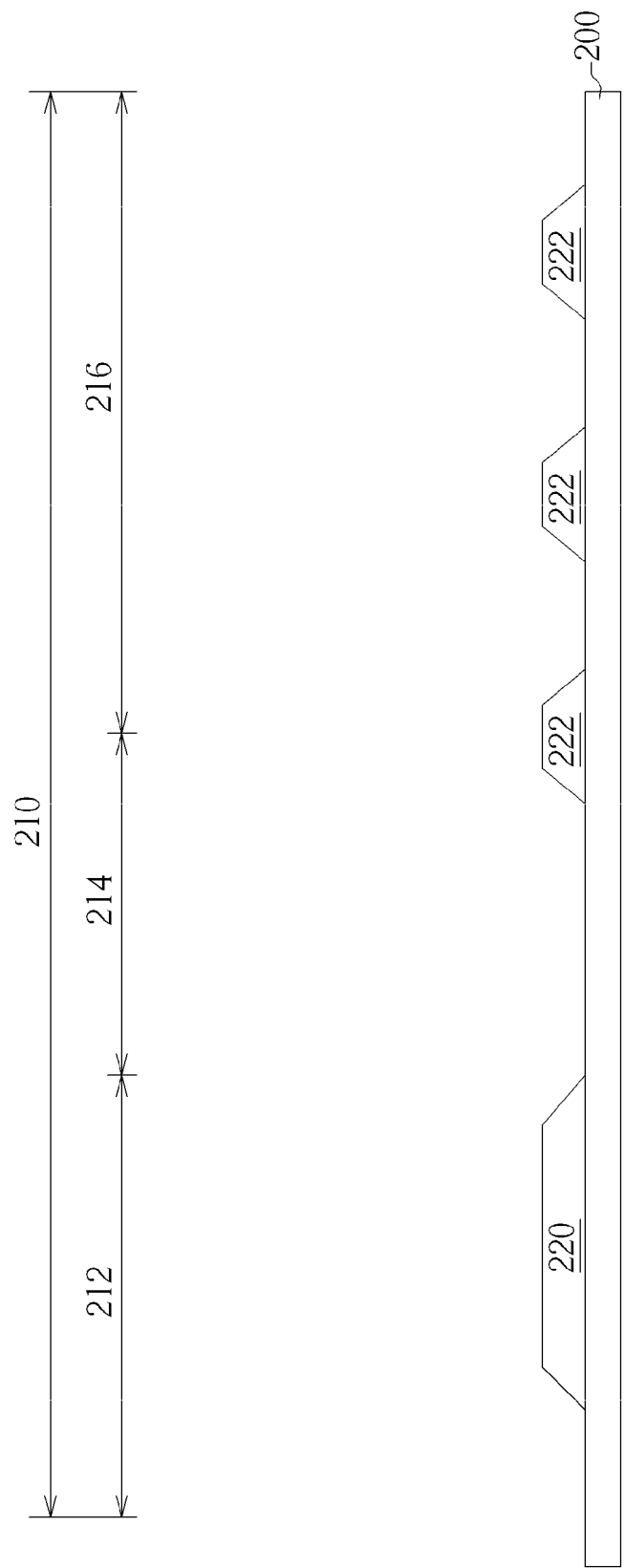
FIGS. 2-6 are schematic drawings illustrating a method for manufacturing a transflective LCD panel according to a first preferred embodiment of the present invention.

Please refer to FIGS. 2-6, which are schematic drawings illustrating a method for manufacturing a transflective LCD panel according to a first preferred embodiment of the present invention. According to the first preferred embodiment, an array substrate 200 is first provided. The array substrate 200 is a transparent substrate that includes glass, quartz, or other transparent materials. The array substrate 200 includes a plurality of pixel regions 210, and each pixel region 210 includes a device region 212, a transmission region 214 and a reflection region 216. The device region 212, the transmission region 214 and the reflection region 216 are arranged in coplanar in the pixel region 210. Next, a first metal layer (not shown) is formed on the array substrate 200. The first metal layer can be Al, Cr, Mo, W, Ta, Cu, or alloys of the abovementioned metals. Then, as shown in FIG. 2, a first photo-etching-process (PEP) is performed to pattern the first metal layer, thus a gate electrode 220 is formed in the device region 212 and a plurality of metal bumps 222 is formed in reflection region 216 simultaneously. The metal bumps 222 are used to cause a rough surface of a following formed reflective layer. Accordingly, mirror effect of the reflective layer is reduced and the reflectivity is improved. In addition, though the PEP is used as the patterning method in this preferred embodiment, those skilled in the art would easily realize that the patterning method is not limited to this.

Figure 3:
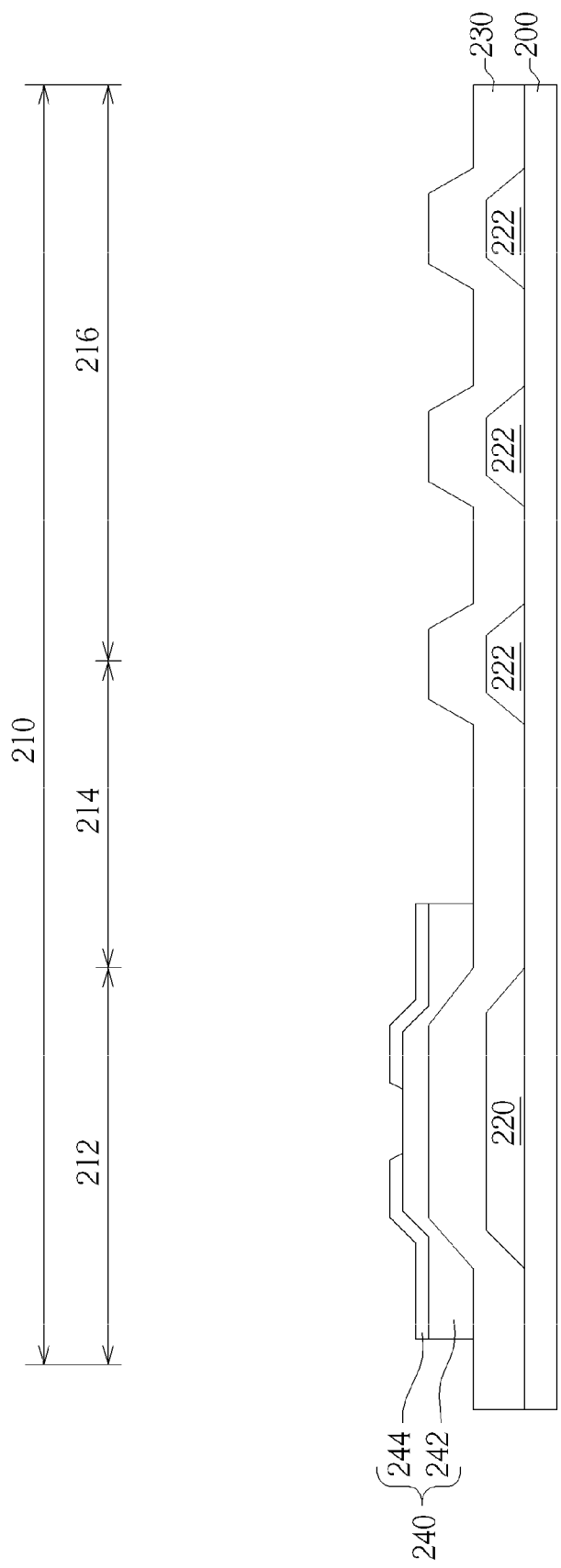

Please refer to FIG. 3. Next, a first insulating layer 230, an amorphous silicon layer 242 and a doped silicon layer 244 are sequentially formed on the array substrate 200. The first insulating layer 230 can be a single or composite layer that comprises silicon oxide (SiO), silicon nitride (SiN) or silicon oxynitride (SiON). The first insulating layer 230 covers the gate electrode 220 and the metal bumps 222 in the reflection region 216, therefore a rough surface is obtained by covering the metal bumps 222 in the reflection region 216. The doped silicon layer 244 is preferably an N-type doped silicon layer for providing Ohmic contact to a following formed source/drain. Then, a second PEP is performed to pattern the amorphous silicon layer 242 and the doped silicon layer 244 to form a patterned semiconductor layer 240 on the gate electrode 220 in the device region 212.

Figure 4:
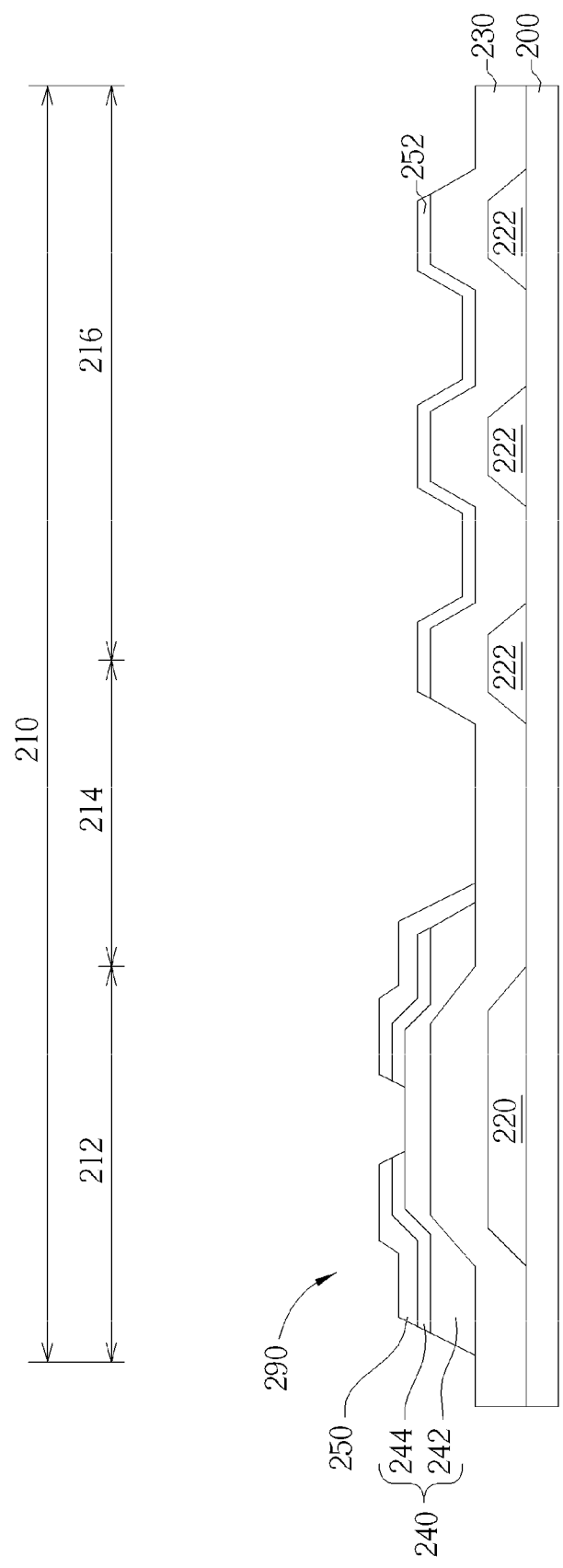

Please refer to FIG. 4. Forming a second metal layer (not shown) on the patterned semiconductor layer 240 and the first insulating layer 230. The second metal layer can be Al, Cr, Mo, W, Ta, Cu, or alloys of the abovementioned metals. A third PEP is performed to pattern the second metal layer, thus a metal source/drain 250 is formed on the patterned semiconductor layer 240 in the device region 212 and a reflective layer 252 is formed in the reflection region 216 simultaneously. It is noteworthy that because the reflective layer 252 covers the first insulating layer 230 and the metal bumps 222, the reflective layer 252 also obtains a rough surface and the reflectivity of the reflective layer 252 is consequently improved. The gate electrode 220, the first insulating layer 230, the patterned semiconductor layer 240 and the source/drain 250 in the device region 212 construct a TFT 290.

Figure 5:
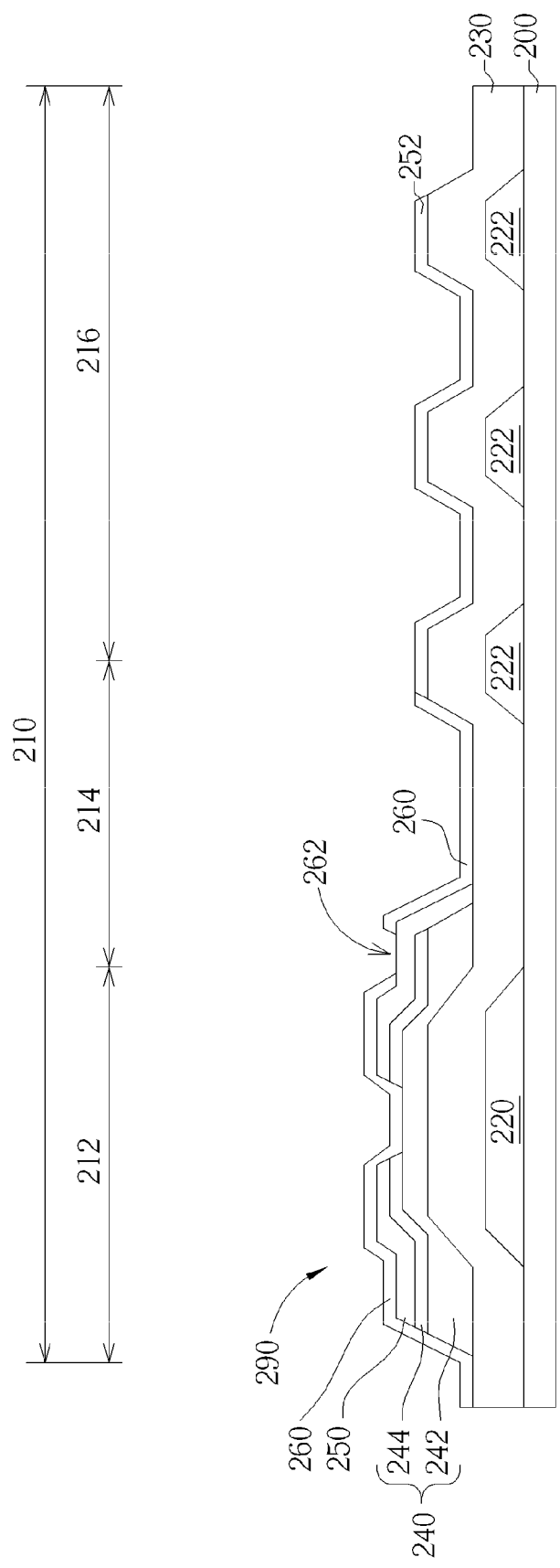

Please refer to FIG. 5. After forming the reflective layer 252, a second insulating layer (not shown) is formed on the array substrate 200 and followed by performing a fourth PEP to pattern the second insulating layer. Thus, a patterned second insulating layer 260 covering the source/drain 250 in the device region 212 and the first insulating layer 230 in the transmission region 214 is formed as shown in FIG. 5. It is noteworthy that the patterned second insulating layer 260 includes at least a contact hole 262 for exploring a portion of the source/drain 250.

Figure 6:
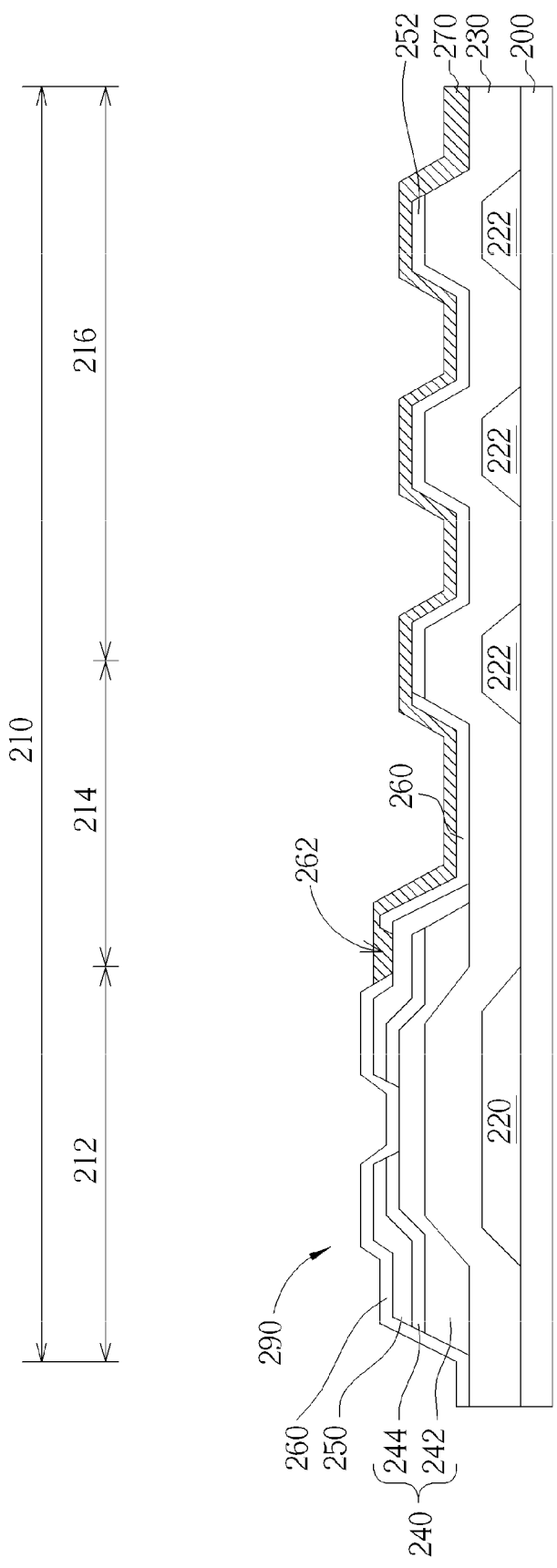

Please refer to FIG. 6. After forming the patterned second insulating layer 260, a pixel electrode 270 is formed on the array substrate 200. The pixel electrode 270 can comprise transparent material such as indium tin oxide (ITO) or indium zinc oxide (IZO). The pixel electrode 270 is formed in the transmission region 214 and on the reflective layer 252 in the reflection region 216 by performing a fifth PEP. And the pixel electrode 270 is electrically connected to the source/drain 250 of the TFT 290 through the contact hole 262.

Figure 7:
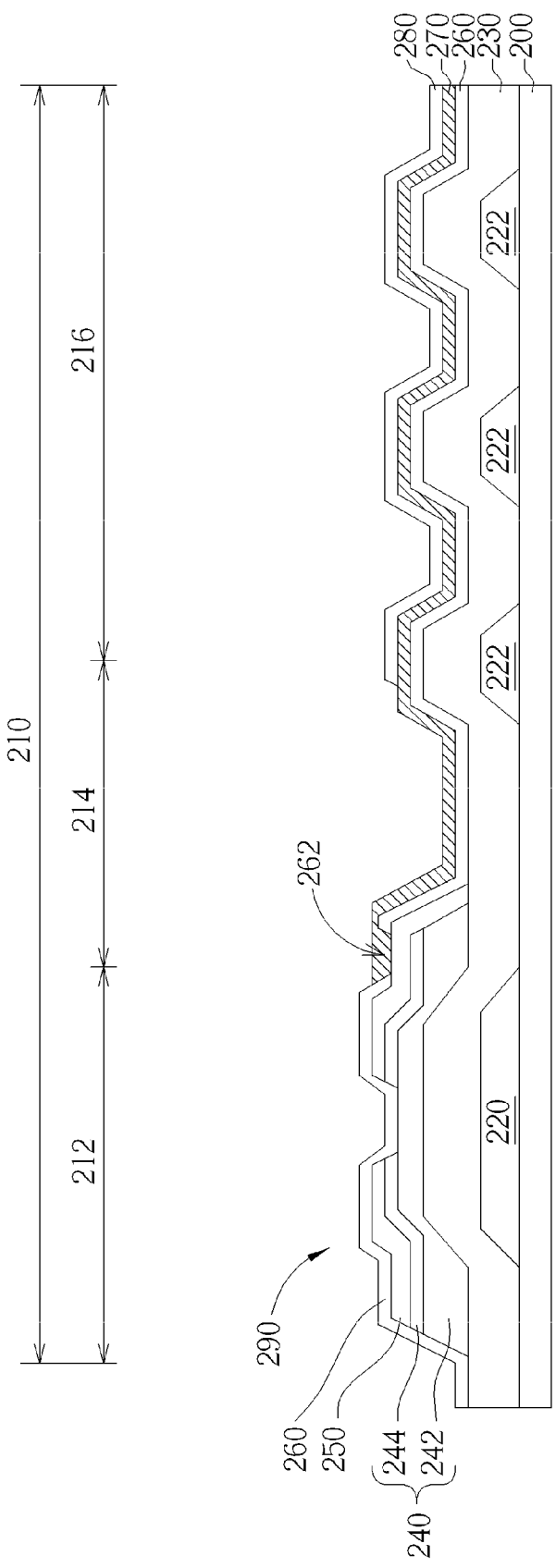
FIG. 7 is a schematic drawing illustrating a modification of the first preferred embodiment.
Figure 8:
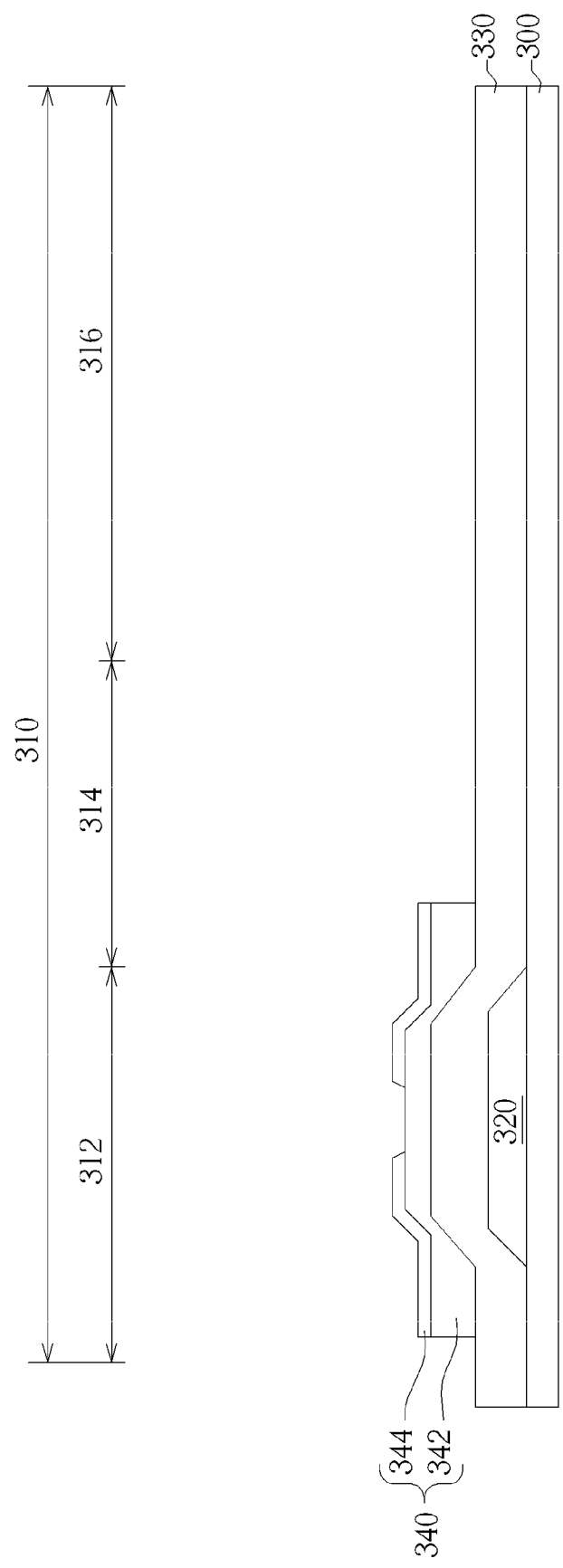
FIGS. 8-12 are schematic drawings illustrating a method for manufacturing a transflective LCD panel according to a second preferred embodiment of the present invention.

Please refer to FIG. 7, which is a schematic drawing illustrating a modification of the first preferred embodiment according to the present invention. For the sake of simplicity, portions similar to the first preferred embodiment are denoted by similar reference numerals as shown in FIGS. 2-5 and the description thereof is omitted.

Please refer to both FIG. 5 and FIG. 7. After forming the patterned semiconductor layer 240, a second metal layer is formed on the array substrate 200. The second metal layer includes materials the same with those described in the first preferred embodiment. Then, a third PEP is performed to pattern the second metal layer to form the source/drain 250 on the patterned semiconductor layer 240 in the device region 212. Simultaneously, the second metal layer in the reflection region 216 is selectively removed as shown in FIG. 7, or alternatively, is remained in the reflection region 216 as shown in FIG. 5. As mentioned above, the gate electrode 220, the first insulating layer 230, the patterned semiconductor layer 240 and the source/drain 250 construct the TFT 290. Next, as shown in FIG. 7, the patterned second insulating layer 260 having the contact hole 262 is formed in the transmission region 214 and the device region 212.

Please still refer to FIG. 7. After forming the patterned second insulating layer 260, the pixel electrode 270 is formed on the array substrate 200 in the transmission region 214 and the reflection region 216. The pixel electrode 270 is electrically connected to the source/drain 250 through the contact hole 262. After forming the TFT 290, the patterned second insulating layer 260 and the pixel electrode 270, a third metal layer (not shown) is formed on the patterned second insulating layer 260 and the pixel electrode 270, and is patterned to form a reflective layer 280 on the pixel electrode 270 in the reflection region 216.

Please refer to FIG. 6 and FIG. 7 again. According to the first preferred embodiment and its modification, the metal bumps 222 that cause the rough surface of the reflective layer 252/280 are formed on the array substrate 200 simultaneously with the gate electrode 220 without influencing following processes. In other words, according to the method provided by the first preferred embodiment, the metal bumps 222 are formed without extra photomask. Therefore the process is simplified and the cost is reduced. It is noteworthy that the reflection region 216, the device region 212 and transmission region 214 are arranged in coplanar in the pixel region 210 without overlapping to each other, therefore the height difference between the reflection region 216 and the transmission region 214 and the open line fault of the pixel electrode 270 are avoided. Furthermore, the reflective layer 252 is simultaneously formed with the TFT 290 and under the pixel electrode 270 as shown in FIG. 6, or alternatively formed after forming the TFT 290 and on the pixel electrode 270 as shown in FIG. 7 for improving the reflectivity of the reflection region 216.

Please refer to FIGS. 8-12, which are schematic drawings illustrating a method for manufacturing a transflective LCD panel according to a second preferred embodiment of the present invention. For the sake of simplicity, materials similar to the first embodiment are omitted hereinafter. According to the second preferred embodiment, an array substrate 300 is first provided. The array substrate 300 includes a plurality of pixel regions 310, and each of the pixel regions 310 includes a device region 312, a transmission region 314 and a reflection region 316 arranged in coplanar. Then, a first metal layer (not shown) is formed on the array substrate 300 and followed by performing a first PEP to pattern the first metal layer. Thus a gate electrode 320 is formed in the device region 312. Please still refer to FIG. 8. A first insulating layer 330, an amorphous silicon layer 342 and a doped silicon layer 344 are sequentially formed on the array substrate 300 and followed by patterning the amorphous silicon layer 342 and the doped silicon layer 344. Accordingly, a patterned semiconductor layer 340 is formed on the gate electrode 320 in the device region 312.

Figure 9:
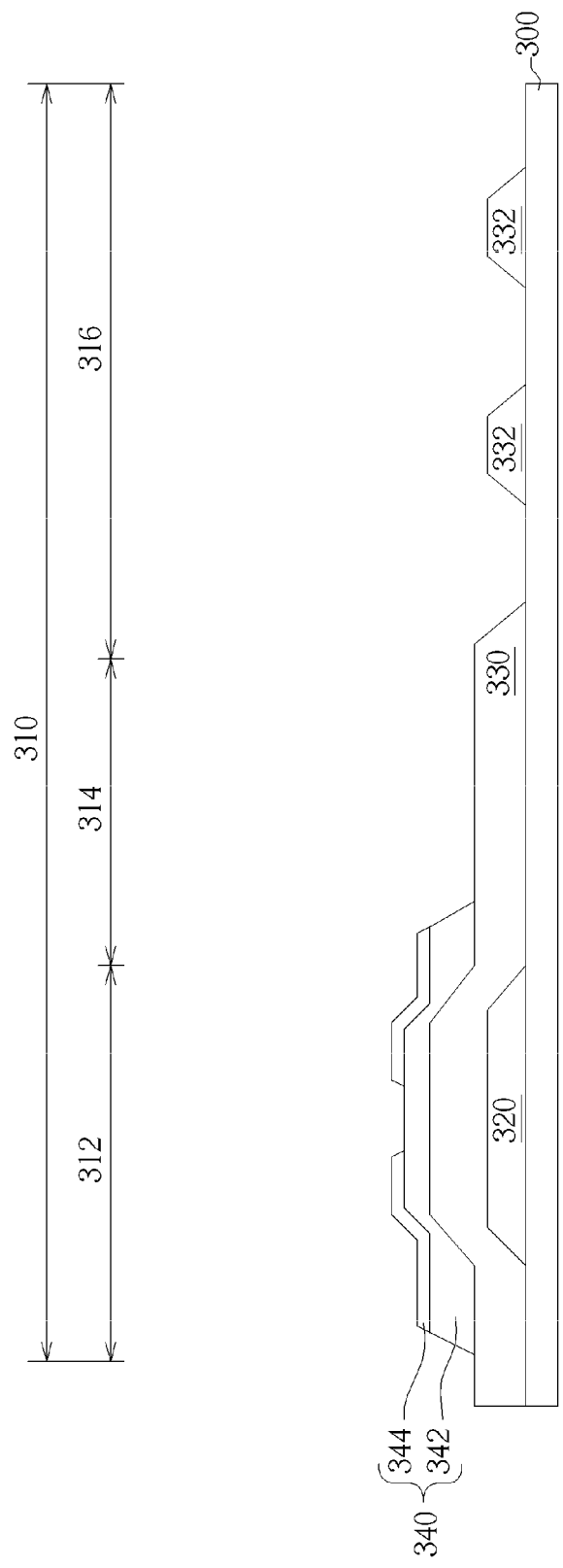

Please refer to FIG. 9. Then, patterning the first insulating layer 330 to form a plurality of insulating bumps 332 in the reflection region 316. The insulating bumps 332 are used to cause a rough surface of a following formed reflective layer to reduce the mirror affect of the reflective layer and to improve the reflectivity.

Figure 10:
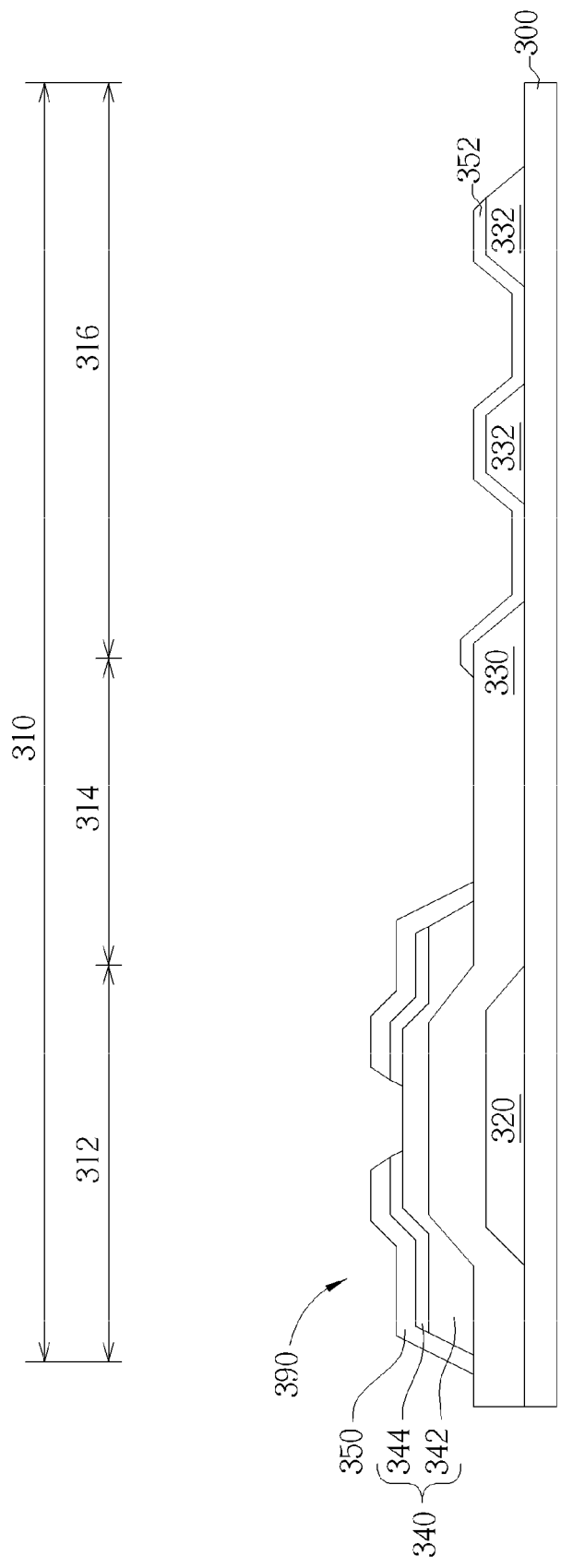

Please refer to FIG. 10. A second metal layer (not shown) is formed on the patterned semiconductor layer 340, the first insulating layer 330 and the insulating bumps 332 and followed by patterning the second metal layer. Therefore a metal source/drain 350 is formed on the patterned semiconductor layer 340 in the device region 312 and a reflective layer 352 is formed in the reflection region 316 simultaneously. It is noteworthy that because the reflective layer 352 covers the insulating bumps 332, the reflective layer 352 formed along the profile of the insulating bumps 332 obtains a rough surface by covering the insulating bumps 332. Consequently, reflectivity is improved. The gate electrode 320, the first insulating layer 330, the patterned semiconductor layer 340 and the source/drain 350 construct a TFT 390.

Figure 11:
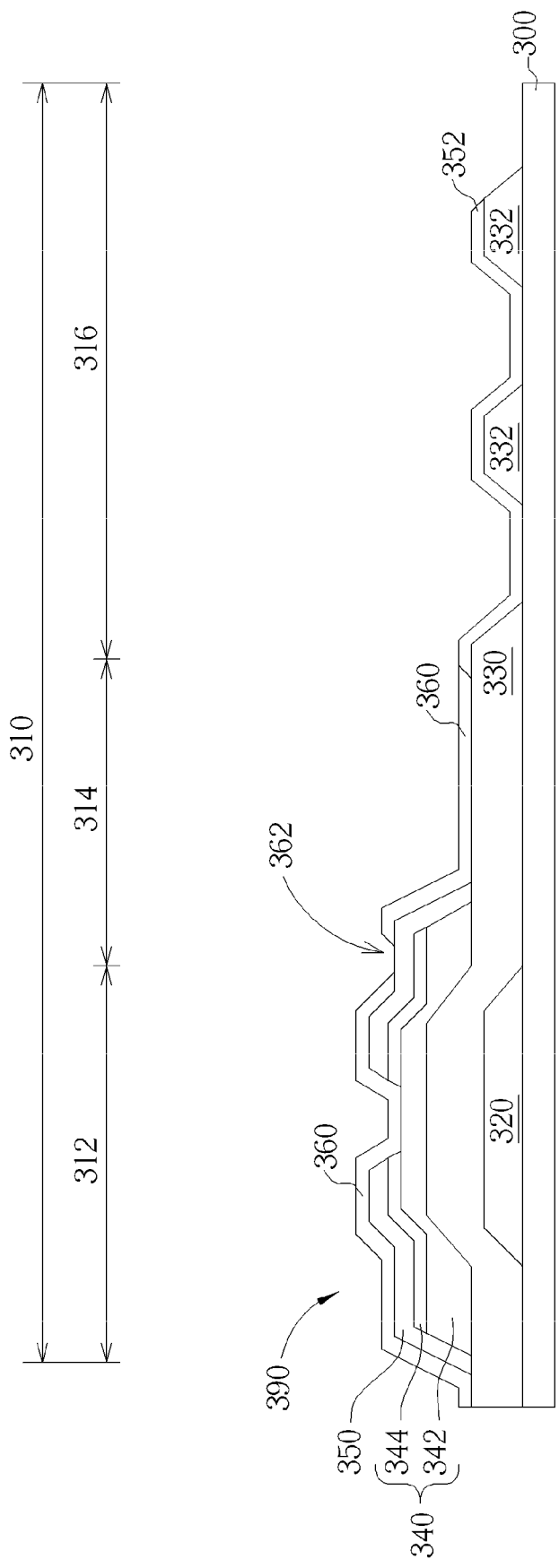

Please refer to FIG. 11. After forming the reflective layer 352, a second insulating layer (not shown) is formed on the array substrate 300 and followed by patterning the second insulating layer. Consequently, a patterned second insulating layer 360 covering the source/drain 350 in the device region 312 and the first insulating layer 330 in the transmission region 314 is formed as shown in FIG. 11. It is noteworthy that the patterned second insulating layer 360 includes at least a contact hole 362 for exploring a portion of the source/drain 350.

Figure 12:
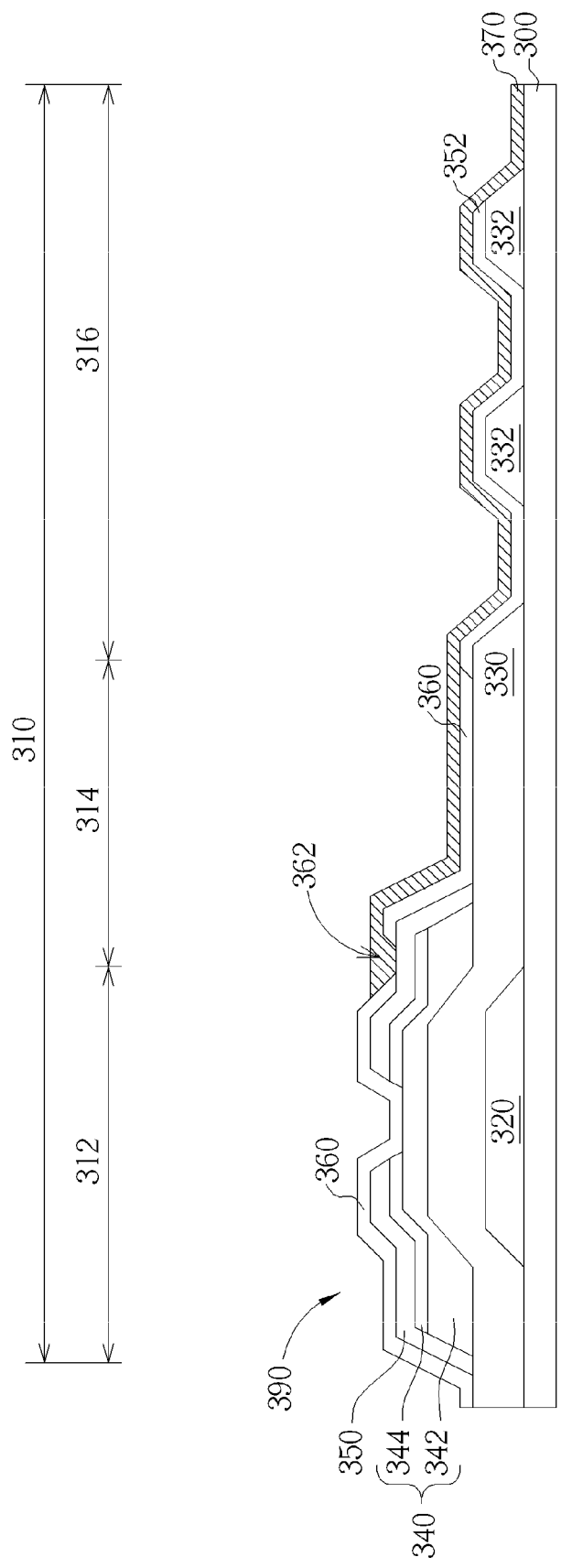

Please refer to FIG. 12. After forming the patterned second insulating layer 360, a pixel electrode 370 is formed on the array substrate 300 in the transmission region 314 and on the reflective layer 352 in the reflection region 316. The pixel electrode 370 is electrically connected to the source/drain 350 through the contact hole 362.

Figure 13:
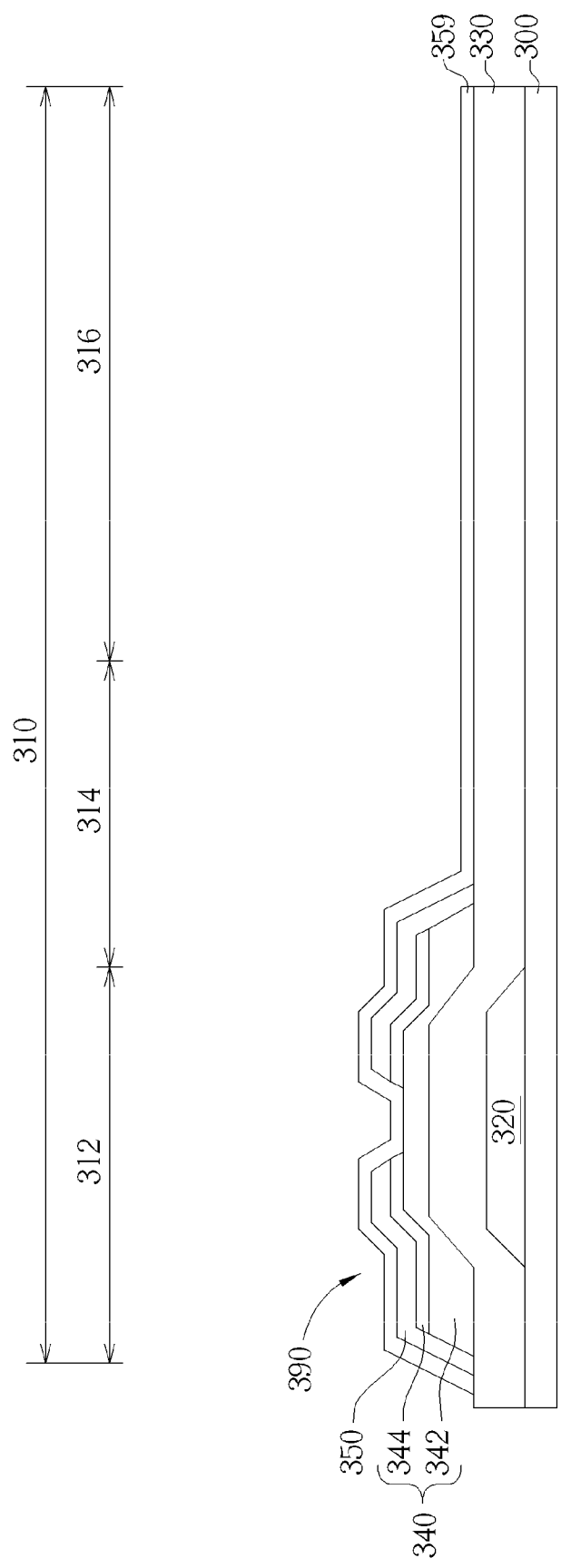
FIGS. 13-14 are schematic drawings illustrating a modification of the second preferred embodiment.
Figure 14:
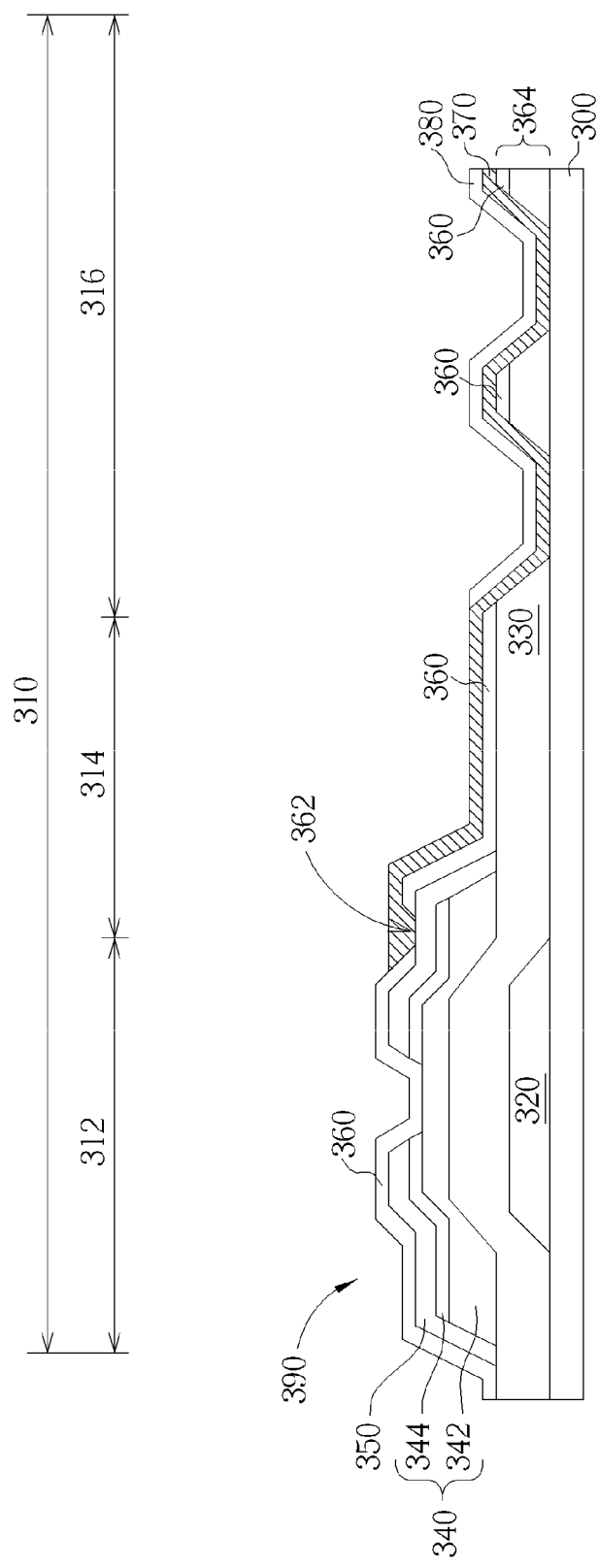

Please refer to FIGS. 13-14, which are schematic drawings illustrating a modification of the second preferred embodiment according to the present invention. For the sake of simplicity, portions similar to the second embodiment are denoted by similar reference numerals as shown in FIGS. 8-12 and the description thereof is omitted.

Please refer to FIG. 13. After forming the patterned semiconductor layer 340, a second metal layer is formed on the array substrate 300 and followed by patterning the second metal layer to form a metal source/drain 350 on the patterned semiconductor layer 340 in the device region 312. The second metal layer in the reflection region 316 is selectively removed as shown in FIG. 13, or alternatively is remained in the reflection region 316 as shown in FIG. 10. As mentioned above, the gate electrode 320, the first insulating layer 330, the patterned semiconductor layer 340 and the source/drain 350 construct the TFT 390. And after forming the source/drain 350, that is, after forming the TFT 390, a second insulating layer 359 is formed on the array substrate 300.

Please refer to FIG. 14. Since the etching rates between the first insulating layer 330 and the second insulating layer 359 are similar, the first insulating layer 330 in the reflection region 316 is also patterned during patterning the second insulating layer 359 in the device region 312 and the transmission region 314. Thus a plurality of insulating bumps 364 is formed. And after patterning the second insulating layer 359 and forming the insulating bumps 364, the pixel electrode 370 is formed on the array substrate 300 in the transmission region 314 and the reflection region 316. The pixel electrode 370 is electrically connected to the source/drain 350 through the contact hole 362. Then, a third metal layer (not shown) is formed on the insulating bumps 364 and the pixel electrode 370 and followed by patterning the third metal layer. Consequently, a reflective layer 380 is formed on the pixel electrode 370 in the reflection region 316.

Please refer to both FIG. 12 and FIG. 14. According to the second preferred embodiment and its modification, the insulating bumps 332 that cause the rough surface of the reflective layer 352/380 are formed on the array substrate 300 by patterning the first insulating layer 330 with an extra photomask. Additionally, the insulating bumps 364 also can be formed by patterning the first insulating layer 330 simultaneously with patterning the second insulating layer 359 without extra photomask. Therefore the process is simplified and the cost is reduced. It is noteworthy that the reflection region 316, the device region 312 and transmission region 314 are arranged in coplanar in the pixel region 310 without overlapping to each other, therefore the height difference between the reflection region 316 and the transmission region 314 and the open line fault of the pixel electrode 370 are avoided. Furthermore, the reflective layer 352 is simultaneously formed with the TFT 390 and under the pixel electrode 370 as shown in FIG. 12, or alternatively formed after forming the TFT 390 and on the pixel electrode 370 as shown in FIG. 14 for improving the reflectivity of the reflection region 316.

As mentioned above, according to the transflective LCD panel and manufacturing method thereof provided by the present invention, the bumps are formed without introducing any extra photomask. Therefore the process is simplified and the cost is reduced. Furthermore, since the reflection region, the device region and transmission region are arranged in coplanar in the pixel region without overlapping to each other, the height difference between the reflection region and the transmission region and the open line fault of the pixel electrode are avoided. In addition, transflective LCD panel and manufacturing method thereof provided by the present invention is not limited to a dual-cell gap or single-cell gap transflective LCD panel.

Those skilled in the art will readily observe that numerous modifications and alterations of the device and method may be made while retaining the teachings of the invention.

What is claimed is:
1. A method for manufacturing a transflective liquid crystal display (LCD) panel comprising steps of:
 providing an array substrate having a plurality of pixel regions, each of the pixel regions comprising a device region, a transmission region and a reflection region;
 forming a first metal layer on the array substrate;

patterning the first metal layer to form a gate electrode in the device region and a plurality of metal bumps in the reflection region simultaneously;

forming a first insulating layer on the array substrate, the first insulating layer covering the gate electrode and the metal bumps, and the first insulating layer having a rough surface by covering the metal bumps;

forming a patterned semiconductor layer on the gate electrode in the device region;

forming a reflective layer in the reflection region, the reflective layer covering the first insulating layer and having a rough surface by covering the first insulating layer;

forming a patterned second insulating layer and a pixel electrode on the array substrate after forming the reflective layer, the patterned second insulating layer not covering the reflective layer.

2. The method of claim 1, wherein the step of forming the reflective layer further comprises:

forming a second metal layer on the patterned semiconductor layer and the first insulating layer; and patterning the second metal layer to form a source/drain on the patterned semiconductor layer and the reflective layer in the reflection region simultaneously.

3. The method of claim 1, further comprises a step of forming a source/drain on the patterned semiconductor layer before forming the patterned second insulating layer and the pixel electrode.

* * * * *